(12) United States Patent
Campbell et al.

(10) Patent No.: US 8,553,488 B2
(45) Date of Patent: Oct. 8, 2013

(54) PERFORMING STUCK-AT TESTING USING MULTIPLE ISOLATION CIRCUITS

(75) Inventors: Brian J. Campbell, Cupertino, CA (US); Daniel C. Murray, Morgan Hill, CA (US); Conrad H. Ziesler, Seattle, WA (US)

(73) Assignee: Apple Inc., Cupertino, CA (US)

( * ) Notice: Subject to any disclaimer, the term of this patent is extended or adjusted under 35 U.S.C. 154(b) by 182 days.

(21) Appl. No.: 13/157,433

(22) Filed: Jun. 10, 2011

(65) Prior Publication Data

US 2012/0314516 A1 Dec. 13, 2012

(51) Int. Cl.
*G11C 5/14* (2006.01)

(52) U.S. Cl.
USPC .............................. 365/227; 365/201; 365/226

(58) Field of Classification Search
USPC .............. 365/189.011, 201 X, 226 X, 227 O, 365/201, 226, 227
See application file for complete search history.

(56) References Cited

U.S. PATENT DOCUMENTS

| | | | |
|---|---|---|---|
| 4,879,690 A | 11/1989 | Anami et al. | |
| 5,450,365 A | 9/1995 | Adachi | |
| 6,301,172 B1 | 10/2001 | Derner et al. | |
| 6,321,320 B1 | 11/2001 | Fleischman et al. | |
| 6,501,306 B1 | 12/2002 | Kim et al. | |
| 6,529,439 B2 | 3/2003 | Uchida et al. | |
| 6,873,561 B2 * | 3/2005 | Ooishi ........................... | 365/226 |
| 6,920,060 B2 | 7/2005 | Chow et al. | |
| 7,000,214 B2 | 2/2006 | Iadanza et al. | |
| 7,019,559 B2 | 3/2006 | Kouzuma | |
| 7,085,972 B2 | 8/2006 | Borri et al. | |
| 7,098,692 B2 | 8/2006 | Joshi et al. | |
| 7,120,061 B2 | 10/2006 | Daga | |
| 7,235,934 B2 | 6/2007 | Hung et al. | |
| 7,245,532 B2 | 7/2007 | Jyouno et al. | |
| 7,298,157 B2 * | 11/2007 | Kim ......................... | 324/750.05 |
| 7,355,905 B2 | 4/2008 | Campbell et al. | |
| 7,474,571 B2 | 1/2009 | Campbell et al. | |
| 7,652,504 B2 | 1/2010 | Campbell et al. | |
| 7,834,662 B2 | 11/2010 | Campbell et al. | |
| 7,915,920 B2 | 3/2011 | Campbell et al. | |
| 2001/0008491 A1 | 7/2001 | Sumimoto | |
| 2003/0179032 A1 | 9/2003 | Kaneko et al. | |
| 2004/0232944 A1 | 11/2004 | Bu et al. | |

(Continued)

OTHER PUBLICATIONS

International Search Report and Written Opinion for PCT/US2006/026096, mailed Nov. 23, 2006, 11 pages.

(Continued)

*Primary Examiner* — Vanthu Nguyen
(74) *Attorney, Agent, or Firm* — Meyertons, Hood, Kivlin, Kowert & Goetzel, P.C.

(57) ABSTRACT

A memory may include a memory array, a plurality of control circuits, and a plurality of isolation circuits. The plurality of control circuits may be configured to generate control signals for the memory array. For example, the plurality of control circuits may include a plurality of word line driver circuits. The plurality of isolation circuits may be configured to receive the control signals from the plurality of control circuits and a plurality of isolation signals. A first isolation signal may correspond to the plurality of word line driver circuits and at least one second isolation signal may correspond to other ones of the plurality of control circuits. The first isolation signal and the second isolation signal may be independently controlled during memory tests to detect stuck-at faults associated with the plurality of isolation signals.

14 Claims, 9 Drawing Sheets

(56) References Cited

U.S. PATENT DOCUMENTS

| | | |
|---|---|---|
| 2005/0237099 A1 | 10/2005 | Tachibana et al. |
| 2010/0208510 A1 | 8/2010 | Hosono et al. |
| 2010/0254206 A1 | 10/2010 | Campbell et al. |

OTHER PUBLICATIONS

"P.A. Semi: The PWRficient Processor Family," PA SEMI: Power to Perform, Jan. 2006, pp. 1-31.

* cited by examiner

PERFORMING STUCK-AT TESTING USING MULTIPLE ISOLATION CIRCUITS

BACKGROUND

1. Field of the Invention

This invention is related to the field of integrated circuits and, more particularly, to performing stuck-at testing of memories.

2. Description of the Related Art

For a variety of reasons, it is desirable to operate an integrated circuit at the lowest supply voltage possible while providing correct operation and the desired level of performance. However, there are limits to the amount by which the supply voltage may be reduced.

Reducing the supply voltage often reduces the performance of the circuits supplied by that supply voltage. If some circuits in the integrated circuit are busy (and thus need to perform at or near peak operation), the supply voltage must generally remain at a relatively high level. Other, less busy circuits could operate at reduced voltages (or could even be powered off if idle). Additionally, in some cases, the logic circuitry can operate at a lower voltage than a corresponding on-chip memory can operate and still be read and written correctly. One technique to permit variation in the supply voltages on the integrated circuit is to divide the integrated circuit into voltage "domains" that are supplied by separate supply voltages that can be independently adjusted. That is, the supply voltage for circuits in a given voltage domain is the supply voltage connected to that voltage domain. Thus, some voltages may be reduced (or even powered down completely) while others remain high for full speed operation.

Once voltage domains that may be at different levels are introduced, it is often required to level shift signals from one domain to another to ensure proper operation in the receiving voltage domain. If the supply voltage from the source voltage domain of a level shifter is powered down, all input signals may be reduced to ground voltage, which may result in an inaccurate signal being provided to the receiving voltage domain by the level shifter. Inaccurate operation can result.

SUMMARY

Various embodiments of a system and method for performing stuck-at testing of memories using multiple isolation circuits are provided.

For example, a testing circuit may be used to perform stuck-at testing for a memory. The memory may include a memory array as well as multiple control circuits for performing various operations on the memory array. The control circuits may be any of a variety of control circuits, such as word line driver circuits, write enable driver circuits, sense amp driver circuits, etc.

Additionally, the memory may include isolation circuits that are configured to isolate various ones (or sets) of the control circuits of the memory from outside signals. For example, each isolation circuit may receive an isolation signal in order to isolate its respective control circuit(s) from an external logic circuit, such as a processor or other logic circuitry in a low power or powered-off state. To support stuck-at testing, there may be separate isolation signals for various ones of the isolation circuits. Even though the isolation signals may be logically equivalent in normal functional mode, the separate isolation signals may be independently controlled in test mode to perform certain desired testing such as stuck-at testing. In one embodiment, the isolation circuits may be implemented as (or include) level shifters.

To perform stuck-at testing, the testing circuit may independently provide isolation signals to various ones of the isolation circuits. For example, the testing circuit may perform various read and write operations while asserting isolation signals for isolation circuits of the write enable driver circuit, the write line driver circuits, and/or the sense amp driver circuit. Accordingly, based on the results of these read and write operations, the testing circuit may determine stuck-at testing results for the memory.

The testing circuit may be controlled via hardware and/or software (e.g., program instructions stored on a memory medium), as desired.

BRIEF DESCRIPTION OF THE DRAWINGS

The following detailed description makes reference to the accompanying drawings, which are now briefly described.

Figure 1:
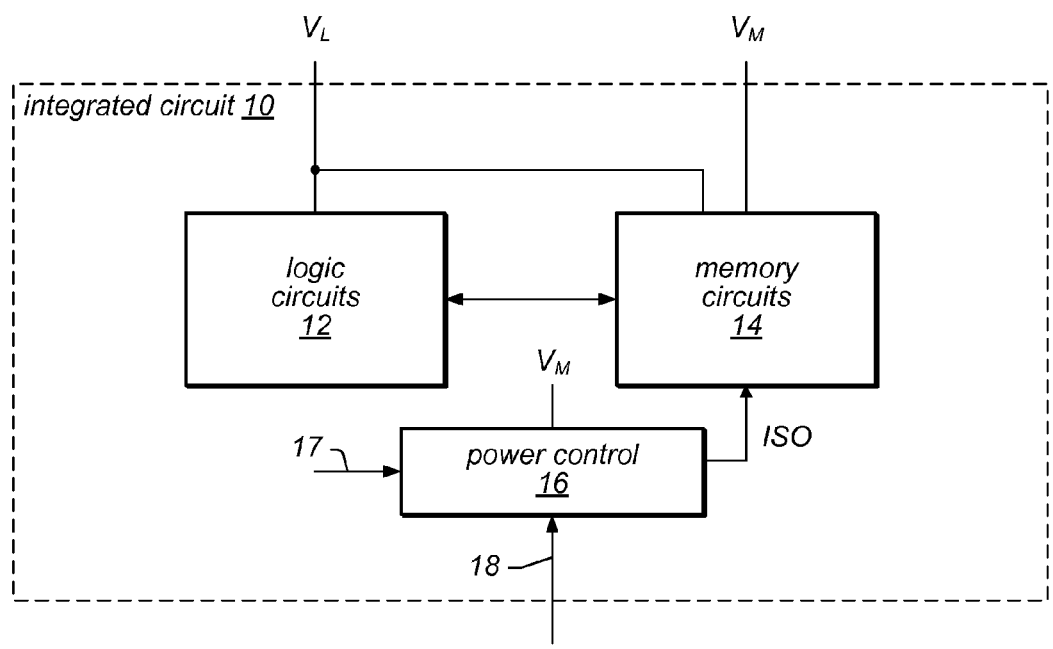
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits to implement the operation. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

FIG. 1—Exemplary Integrated Circuit

Turning now to FIG. 1, a block diagram of one embodiment of an integrated circuit 10 is shown. In the illustrated embodiment, the integrated circuit includes logic circuits 12, memory circuits 14, and a power control circuit 16. The logic circuits 12 are coupled to the memory circuits 14. The power control circuit 16 is coupled to the memory circuits 14 (specifically, via a ISO signal). The logic circuits 12 are powered by a first supply voltage provided to the integrated circuit 10

(labeled $V_L$ in FIG. 1). The memory circuits 14 and the power control circuit 16 are powered by a second power supply voltage provided to the integrated circuit 10 (labeled $V_M$ in FIG. 1). In the illustrated embodiment, the memory circuits 14 are also powered by the $V_L$ supply voltage, as will be explained in more detail for certain embodiments below. The integrated circuit 10 may generally comprise the logic circuits 12, the memory circuits 14, and the power control circuit 16 integrated onto a single semiconductor substrate (or chip), although embodiments where various ones are on different chips are also envisioned.

The logic circuits 12 may generally implement the operation for which the integrated circuit is designed. In some embodiments, the logic circuits 12 may include a processor (e.g., a central processing unit (CPU), graphics processing unit (GPU), microprocessor, etc.). The logic circuits 12 may generate various values during operation, which the logic circuits 12 may store in the memory circuits 14. Additionally, the logic circuits 12 may read various values on which to operate from the memory circuits 14. For example, in various embodiments, the memory circuits 14 may include memory used for caches, register files, integrated-circuit-specific data structures, etc. The memory circuits 14 may implement any type of readable/writeable memory. In an example below, an SRAM memory will be used. It is noted that, while the illustrated embodiment includes multiple logic circuits 12 and multiple memory circuits 14, various embodiments may include at least one logic circuit 12 and at least one memory circuit 14.

Generally, if a logic circuit 12 is to access a memory circuit 14, the logic circuit 12 may generate various control signals to the memory circuit 14. For example, the control signals may include an address identifying the memory location in the memory circuit 14 that is to be accessed, a read enable signal which may be asserted to perform a read, and a write enable signal which may be asserted to perform a write. For a read, the memory circuit 14 may output data to the logic circuit 12. For a write, the logic circuit 12 may supply data to the memory circuit 14 for storage.

By separating the supply voltage for the logic circuits 12 and the memory circuits 14, the supply voltage for the logic circuits 12 ($V_L$) may be reduced below the level at which the memory circuits 14 may operate robustly. The supply voltage for the memory circuits 14 ($V_M$) may be maintained at the minimum supply voltage that provides for robust memory operation (or greater, if desired). Thus, the $V_L$ supply voltage may be less than the $V_M$ supply voltage during use (e.g., when the logic circuits 12 are in a low power state). At other times, the $V_L$ supply voltage may exceed the $V_M$ supply voltage during use (e.g. at times when higher performance is desired and higher power consumption is acceptable to achieve the higher performance). Alternatively, the $V_M$ supply voltage may be increased to match the $V_L$ supply voltage if the $V_L$ supply voltage would otherwise exceed the $V_M$ supply voltage.

In one embodiment, the $V_L$ supply voltage may even be powered down (that is, reduced to the ground reference) while the $V_M$ supply voltage remains active to retain data in the memory circuits 14. The power control circuit 16 may monitor various inputs (internal, illustrated by arrow 17, and/or external, illustrated by arrow 18) to determine that the $V_L$ supply voltage is to be powered down. In one embodiment, the power control circuit 16 may determine that the $V_L$ supply voltage is to be powered down and may issue a power down request to an external power source such as a voltage regulator (not shown in FIG. 1) that supplies the $V_L$ voltage. In other embodiments, internal or external inputs may indicate that the power down is to occur, and the power control unit 16 may detect the event by monitoring the inputs. In either case, the power control unit 16 may assert the ISO signal to the memory circuits 14. The ISO signal may be active high (where the asserted state indicating that the $V_L$ voltage is to be powered off is the logical one state) or active low (where the asserted state is the logical zero state). The deasserted state is the opposite of the asserted state in either case. Various level shifters in the memory circuits 14 may use the ISO signal to assert a predetermined output to other circuitry in the memory circuits 14, as described in more detail below.

Generally, a supply voltage may be a voltage provided to a circuit to power the circuit, providing the electrical energy to permit the circuit to generate one or more outputs responsive to one or more inputs. At various points herein, supply voltages may be referred to as being greater than or less than other supply voltages. That is, the magnitude of the voltage may be greater than (or less than) the magnitude of the other voltage.

Figure 2:
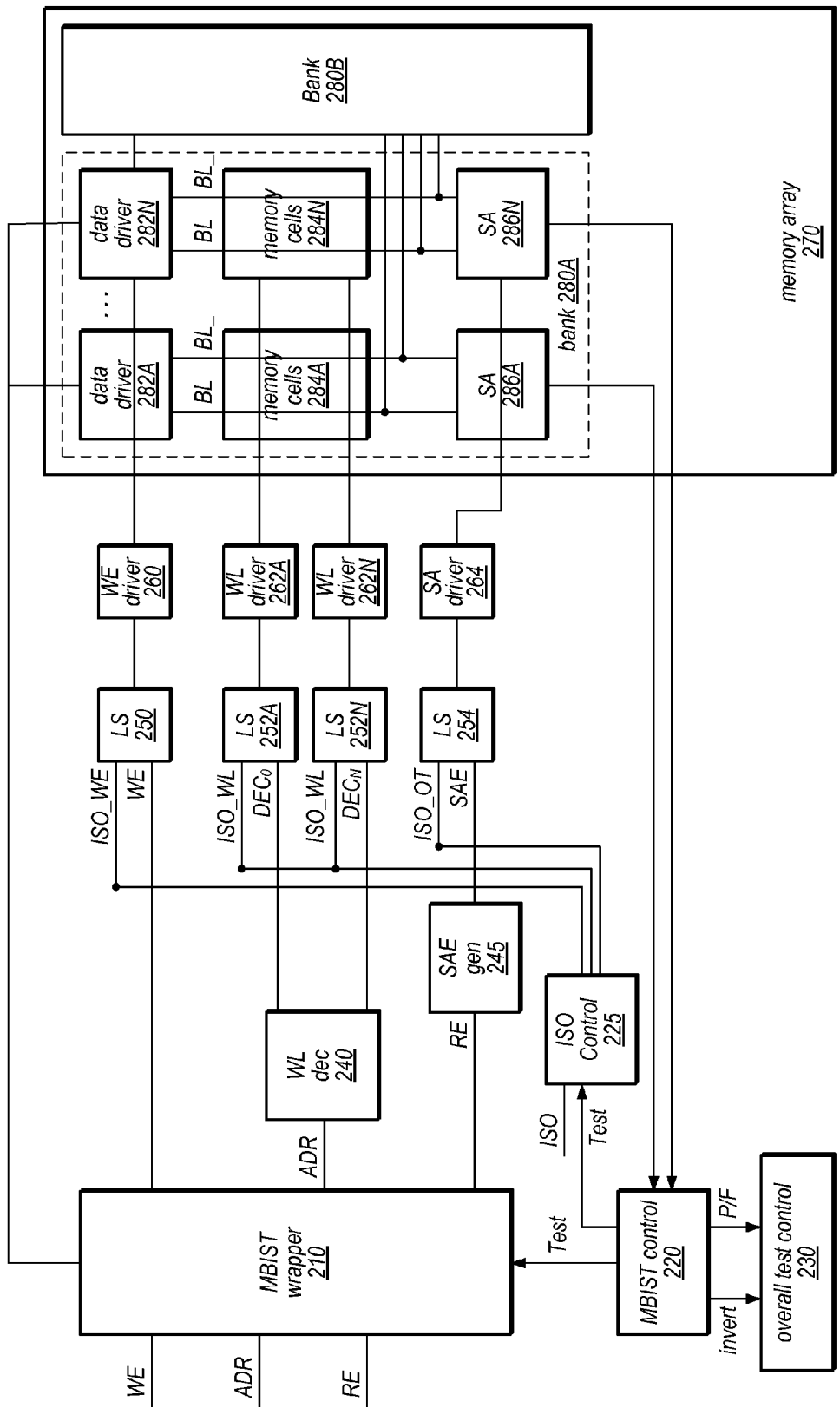
FIGS. 2 and 3 are block diagrams of embodiments of a memory circuit shown in FIG. 1.
Figure 3:
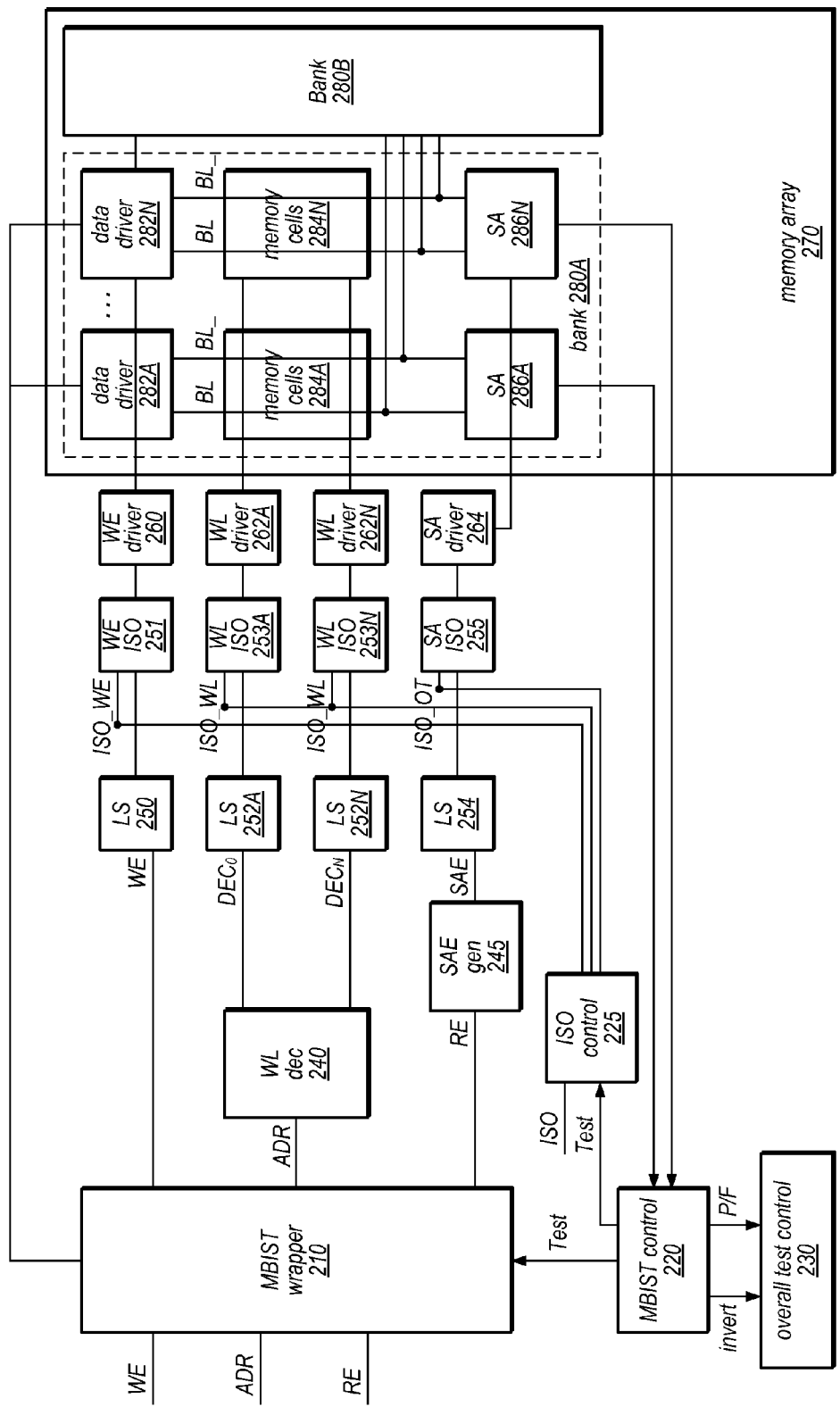
Figure 4:
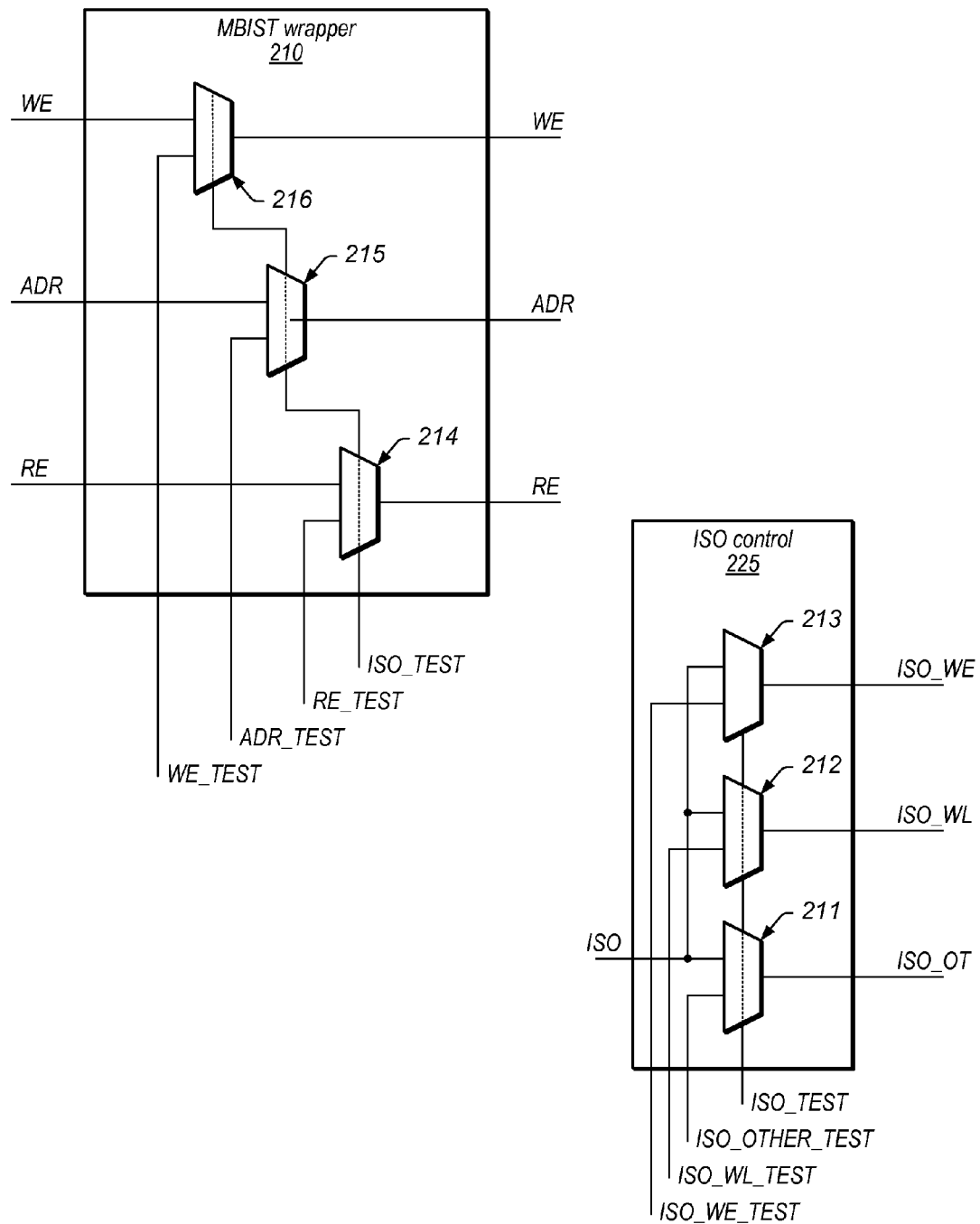
FIG. 4 is a block diagram of the MBIST wrapper and ISO control of FIGS. 2 and 3, according to one embodiment.

FIGS. 2-4—Exemplary Memory Circuit

FIG. 2 illustrates a block diagram of one embodiment of a memory circuit. The memory circuit of FIGS. 2 and 3 may be one of the memory circuits 14. Other memory circuits 14 may be similar. Additionally, various blocks of FIGS. 2-4 may be removed, combined, or added. Thus, the configuration shown in FIGS. 2-4 is exemplary only and other designs are envisioned.

In the embodiments of FIGS. 2 and 3, the memory circuit may include MBIST (memory built in self test) wrapper 210, MBIST control 220, overall test control 230, and ISO control 225. In some embodiments, rather than being implemented separately, as shown in FIG. 2, blocks 210, 220, 225, and 230 may be combined in any number of ways (e.g., all together, or MBIST control 220 combined with overall test control 230 and ISO control 225, etc.). As described herein, one or more of these circuits (combined or separated) may be referred to as a "testing circuit" or "testing circuits"; however, the term "testing circuit" is not limited to the particular implementation of blocks 210, 220, 225, and/or 230. Additionally, while these testing circuits are shown as part of the memory circuit, they may be implemented separately, as desired. Thus, any one or more of the blocks 210, 220, 225, and 230 may be separate from the memory circuit of FIG. 2.

As shown, the MBIST wrapper 210 may receive various signals, such as a write enable (WE) signal address (ADR) signal, and read enable (RE) signal. The WE, ADR, and RE signals may each be received from the logic circuits 12 for performing memory operations. ISO control 225 may receive an ISO signal, e.g., received from the power control circuit 16, such as when the logic circuits 12 enter a lower power state (e.g. a powered off state). Additionally, MBIST wrapper 210 and ISO control 225 may receive various test signals from MBIST control 220. MBIST wrapper 210 may also be connected to data drivers 282A-282N, described further below.

In more detail, FIG. 4 illustrates an exemplary embodiment of block diagrams of the MBIST wrapper 210 and the ISO control 225. As shown in FIG. 4, the WE, ADR, RE, and ISO signals described with respect to FIG. 2 may be received and provided to muxes 211-216 in MBIST wrapper 210 and ISO control 225. More specifically, the WE, ADR, and RE signals may be provided to MBIST wrapper 210 and the ISO signal may be provide to ISO control 225. Additionally, the test signals from MBIST control 220 may be provided to each block. More specifically, MBIST control 220 may provide an ISO_TEST signal to both the MBIST wrapper 210 and the ISO control 225 (specifically to each of the muxes 211-216) in order to select the test signals from MBIST control 220 instead of the WE, ADR, RE, and ISO signals provided from logic circuits 12 and power control circuit 16. In normal operation (e.g., not during memory testing), the signals from the logic circuits 12 and power control circuit 16 are selected. In more detail, ISO_TEST selects ISO_OT_TEST over ISO in mux 211 of ISO control 225, ISO_WL_TEST over ISO in mux 212 of ISO control 225, ISO_WE_TEST over ISO in mux 213 of ISO control 225, RE_TEST over RE in mux 214 of MBIST wrapper 210, ADR_TEST over ADR in 215 of MBIST wrapper 210, and WE_TEST over WE in mux 216 of MBIST wrapper 210. Thus, in FIG. 4, MBIST control 220 may be configured to provide independent isolation signals ISO_WE, ISO_WL, and ISO_OT for independent isolation of the write enable, word line, and other (e.g., sense amp) control circuits of the memory circuit of FIG. 2. In contrast, the provided ISO signal, e.g., from the power control circuit 16, may globally trigger all of the isolation signals, and thus may not have independent control over each type of control circuit as is possible during memory testing.

Returning to FIG. 2, the selected WE signal (either provided from logic circuits 12 or from MBIST control 220) may be provided to level shifter (LS) 250. Additionally, the selected ISO_WE signal may also be provided to LS 250. Similarly, the selected ADR signal may be provided to WL decoder 240, which may decode the provided address and provide appropriate signals to one or more of LS 252A-252N, depending on the provided address. In other embodiments, the word line decoder may be integrated into the word line drivers 262A-262N. The selected ISO_WL signal may also be provided to LS 252A-252N. The selected RE signal may be provided to sense amplifier enable (SAE) generator 245, which may in turn provide a corresponding SAE signal to LS 254. The selected ISO_OT signal may also be provided to LS 254. In further embodiments, the ISO_OT signal may be provided for isolation of other control circuits not shown in FIG. 2.

Each of the LS 250, 252A-252N, and 254 may be coupled to corresponding driver circuits, which may be configured to perform memory operations on memory array 270 based on provided signals (e.g., the WE, ADR, and RE signals). For example, in the embodiment of FIG. 2, LS 250 is coupled to WE driver 260, LS 252A-252N are coupled to WL drivers 262A-262N, and LS 254 is coupled to SA driver 264, each of which are coupled to various elements of the memory array 270.

As shown, the memory array 270 may include multiple memory banks. In the embodiment of FIG. 2, the memory array 270 includes bank 280A, shown expanded, and bank 280B, which may be similar to bank 280A; however, additional banks may be included in the memory array 270. Bank 280A of FIG. 2 includes: data drivers 282A-282N, which may receive input from WE driver 260; memory cells 284A-284N, which may receive input (e.g., via a set of word lines $WL_0 \ldots WL_N$) from WL drivers 262A-262N; and sense amplifiers (SAs) 286A-286N, which may receive input from SA driver 264. In the embodiment of FIG. 2, SAs 286A-286N may be shared between bank 280A and 280B. The control circuits 260, 262A-262N, and 264 may also be coupled to bank 280B, or may be duplicated for controlling bank 280B, depending on the design of the memory. Although not shown in FIG. 2, the memory array 270 is further coupled to receive data (Din, e.g. to the data drivers 282A-282N) and to provide data (Dout, e.g. from the SAs 286A-286N) to/from the logic circuits 12.

The memory cells 284A-284N of the memory array 270 may be supplied by the $V_M$ supply voltage. However, the memory circuit of FIG. 2 may be designed to provide for access to the memory array 270 by the logic circuits 12 even if the logic circuits 12 are supplied with a $V_L$ supply voltage that is less than the $V_M$ supply voltage. Each memory cell may be activated for access (read or write) by one of the word lines $WL_0 \ldots WL_N$ coupled to that memory cell (from each word line driver). One or more memory cells coupled to the same word line form a "word" for access in the memory array 270. That is, the bits of the word may be read/written as a group. The width of the word may thus be the width of a given bank 280A or 280B.

The word line drivers 262A-262N activate a given word line based on address inputs from the logic circuits 12 (or during testing, from testing circuits). The address identifies the word in the memory array 270 to be accessed for a given access generated by the logic circuits 12, e.g., as decoded by WL decoder 240. Generally, each different address causes a different word line $WL_0$ to $WL_N$ to be asserted. Additionally, the WE driver 260 may enable writing via data drivers 282A-282N and the sense amp driver 264 may enable reading via sense amps 286A-286N.

Turning back to the level shifters 250, 252A-252N, and 254, a level shifter circuit may be a circuit configured to level shift an input signal to produce an output signal. Level shifting a signal may refer to changing the high assertion of the signal from one voltage to another. Level shifting may be performed in either direction (e.g. the voltage after level shifting may be higher or lower than the voltage before level shifting). In some embodiments, the low assertion may remain the ground voltage supplied to the integrated circuit 10 (not shown in the figures, often referred to as $V_{SS}$).

The level shifters 250, 252A-252N, and 254 are generally powered by the $V_M$ supply voltage and may be configured to level shift input signals such that the high assertion of the output is at a $V_M$ voltage. Additionally, responsive to assertion of the ISO signal, the level shifters may be configured to provide a predetermined voltage on the output. For example, the level shifters may be configured to provide a predetermined voltage level on the output signal if the $V_L$ supply voltage is to be powered down, independent of the input signal to the level shifters. The predetermined voltage level may be the level that is considered "safe" for the receiving circuitry. For example, in the case of FIG. 2, LS 252A-N are coupled to word line drivers 262A-N. Accordingly, the safe voltage may be the high ($V_M$) voltage, so that the word line drivers are inactive. In other cases, the safe voltage may be the low (ground) voltage, or any other desired voltage level. Various level shifters may implement various predetermined voltage levels, even in the same design, dependent on the safe voltage levels for the receiving circuitry.

When the $V_L$ supply voltage is to be powered down, since the input signal is generated by circuitry powered by the $V_L$ supply voltage (and thus is powered down), the input signal may be at a ground voltage (or may even float at indeterminate levels). By providing the predetermined voltage level during such time periods, the level shifters may provide predictable behavior for the receiving circuitry. If predicable behavior was not provided, various undesired effects could occur. For example, for the embodiment of FIG. 2 (in which the level shifters provide signals for the memory array 270), data in the memory could be accidentally overwritten. Or, circuitry that normally is not active at the same time (e.g. bitline prechargers and word line drivers) could be active at the same time and thus cause contention, which could damage the memory circuits and/or cause undesirable power consumption. Still further, when the $V_L$ supply voltage is powered up again, unpredictable logic circuit initializations and/or transitions on the input signals to the level shifters may occur, but the forced value on the output may prevent such unpredictable behavior from reaching the memory circuits. In the present embodiment, the assertion of the ISO signal indicates that the $V_L$ supply voltage is to be powered down, and the ISO signal may remain asserted while the $V_L$ supply voltage is off, in this embodiment.

Because of the issues related to the ISO signal enumerated above, it may be particularly desirable to ensure that the ISO signal paths properly operate. More specifically, the testing circuits 210, 220, and 230 may be used to perform stuck-at testing of the memory circuit of FIG. 2 to ensure that the memory circuit does not encounter the described issues due to a stuck at fault related to the ISO signal. For example, consider a memory fault where the ISO_WL signal pathway is stuck at '0' and thus does not isolate when the $V_L$ supply voltage is removed. In this example, multiple word lines could be active due to a stuck-at zero fault on the isolation signal local to the word line level shifters 252A-252N (thus preventing the generation of the "safe" voltage to the word line drivers, which would prevent activation of the word lines). If multiple word lines were active, memory contents could be corrupted (e.g. if the activated memory cells are storing different values, some of the cells might have their values overwritten). However, it may not be possible to test for such errors without independently controlling isolation of the various control circuits (e.g., providing for separate isolation of the WE driver, the WL drivers, and/or the SA driver). More specifically, with a single isolation signal, the MBIST test could pass with the above stuck-at zero fault if the write enable and sense amp isolation signals are not stuck (and thus the WE and SAE signals are not asserted to the memory array 270). Other concerns include power contention if a word line or the write enable are active while precharge is active. If the ISO signal were stuck at one, on the other hand, normal MBIST would detect the isolated memory circuits due to memory read or write failures.

FIG. 3 provides an alternate embodiment to FIG. 2 where LS 250, 252A-252N, and 254 are coupled to isolation circuits 251, 253A-253N, and 255, respectively, before being coupled to drivers 260, 262A-262N, and 264, respectively. In this embodiment, the isolation signals from ISO control 225 may be provided to the isolation circuits 251, 253A-253N, and 255 rather than to LS 250, 252A-252N, and 254. In one embodiment, the ISO blocks 251, 253A-253N, and 255 may be implemented as an AND gate with the ISO input inverted. Thus, each ISO block may receive the output of the LS as well as the ISO signal to perform isolation of the corresponding drivers.

In the embodiments described below, memory tests are described for testing the memory circuit using multiple, independently controlled isolation signals and circuits. In the particular embodiment of FIGS. 2 and 3, the MBIST control 220 may perform the tests and provide pass/fail results to the overall test control 230. However, because some of the tests described below pass when a test pattern is not returned (which may normally be considered a "fail"), the MBIST control 220 may also provide an invert signal to invert a pass to a fail or a fail to pass, depending on the situation. However, in alternate embodiments, such an inversion may not be required and the MBIST control 220 may include the intelligence to provide a correct pass or fail value to the overall test control 230. As indicated above, the MBIST control 220 and overall test control 230 may be combined as a single testing circuit.

Figure 5:
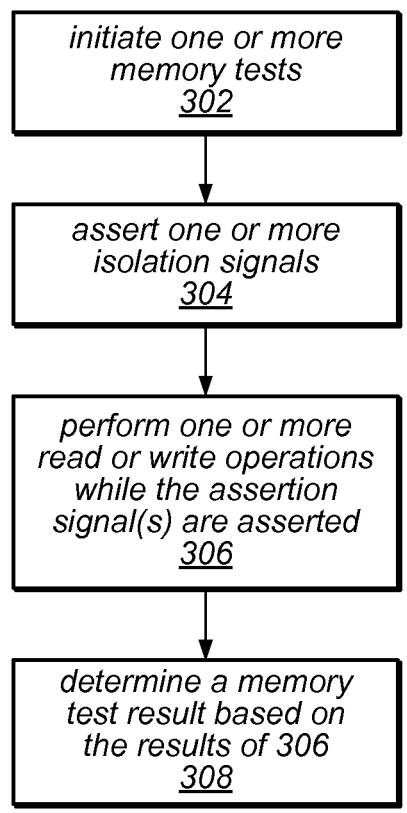
FIG. 5 is a flowchart diagrams illustrating one embodiment of a method for performing stuck at testing using multiple isolation circuits.

FIG. 5—Method for Testing a Memory Using Multiple Isolation Circuits

FIG. 5 illustrates a method for testing a memory using multiple independent isolation circuits and signals. The method shown in FIG. 5 may be used in conjunction with any of the systems or devices shown in the above Figures, among other devices. In various embodiments, some of the method elements shown may be performed concurrently, in a different order than shown, or may be omitted. Additional method elements may also be performed as desired. As shown, this method may operate as follows.

In 302, one or more memory tests may be initiated. For example, the one or more memory tests may test isolation of control circuits of the memory, such as the WE driver 260, the WL drivers 262A-262N, and/or the SA driver 264, among other possibilities. The one or more memory tests may be performed by a testing circuit (e.g., any one or more of MBIST control 220, ISO control 225, overall test control 230, and/or MBIST wrapper 210).

In 304, isolation signals for controlling isolation of various ones (or sets) of the control circuits may be asserted. For example, the isolation signals may be provided by MBIST control 220 and may assert isolation signals for the WE control circuit, the WL control circuit, and/or the SA control circuit, among other possibilities. The isolation signals may be provided to respective isolation circuits of the memory. The isolation circuit may be implemented by (or may include) the level shifters described with regard to FIG. 2, the isolation circuits of FIG. 3, etc.

In 306, while at least one isolation signal is asserted, one or more read or write memory operations may be performed using the control circuits of the memory circuit.

Figure 6:
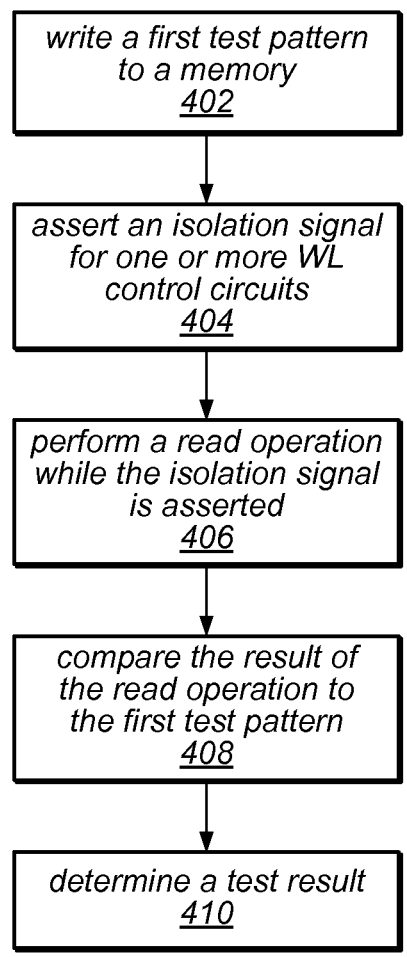
FIGS. 6-8 are flowchart diagrams illustrating embodiments of specific tests for performing stuck at testing using multiple isolation circuits.
Figure 7:
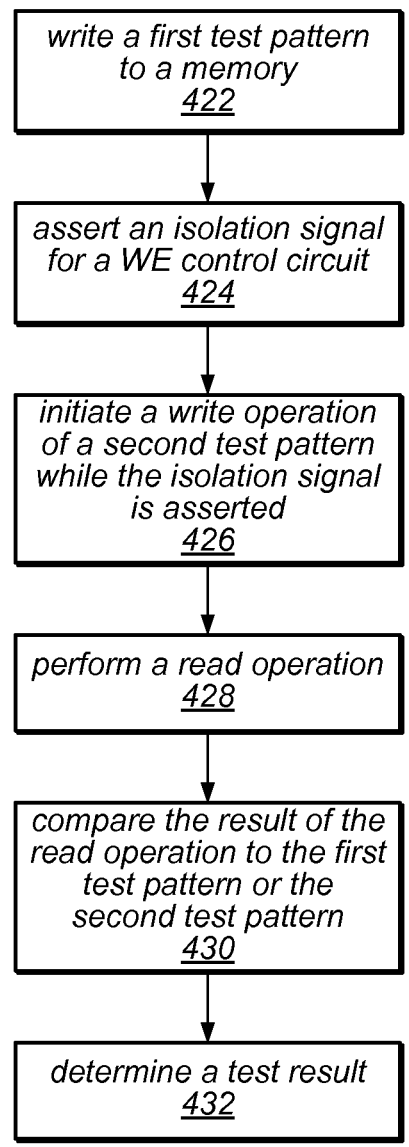
Figure 8:
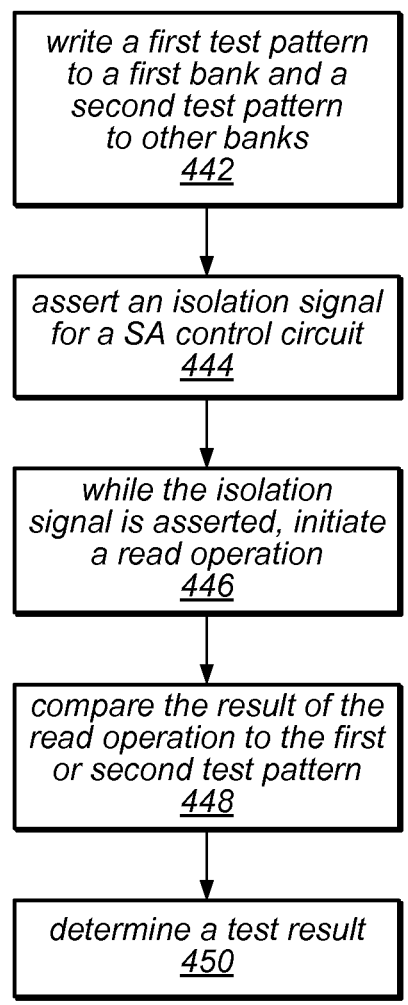

In 308, a memory test result may be determined based on 306. The memory test result may also be based on one or more read or write operations performed before or after 304 and 306. For example, a read or write operation may be performed before or after 304 and 306, and the operation and the result of 306 may be compared. FIGS. 6-8 provide more specific embodiments for performing memory tests (e.g., stuck-at fault memory tests). In some embodiments, the test result in 308 may be based on a single memory test (e.g., one of the memory tests of FIGS. 6-8) or may be based on multiple memory tests (e.g., determining a pass or fail for the memory based on some or all of the tests described below).

FIG. 5 may be a generic illustrating of the isolation signal testing method. Specific examples are shown in more detail with regard to FIGS. 6-8, described in more detail below.

FIGS. 6-8—Exemplary Memory Tests

FIGS. 6-8 illustrate exemplary methods for testing a memory using multiple isolation circuits and signals. The methods shown in FIGS. 6-8 may be used in conjunction with any of the systems or devices shown in the above Figures, among other devices. In various embodiments, some of the method elements shown may be performed concurrently, in a different order than shown, or may be omitted. Additional method elements may also be performed as desired. As shown, this method may operate as follows.

More specifically, FIG. 6 illustrates an exemplary method for testing for stuck at zero on the isolation signal to the word line circuits.

In 402, a first test pattern may be written to a first bank of a memory. The first test pattern may be written to a single bank of the memory or all banks of the memory, as desired. According to various embodiments, the first test pattern may be one of the following: 1) all zeros, 2) all ones, 3) 1010..., 4) 0101..., etc. The first test pattern may be written based on input from a testing circuit (e.g., providing a WE signal, an address for the write, and the test pattern). During 402, none of the isolate signals may be asserted.

In 404, an isolation signal for one or more WL control circuits may be asserted. For example, the testing circuit may select test signals and may assert an isolation signal for the WL circuits (ISO_WL_TEST asserted). In one embodiment, the isolation signals for other circuits (ISO_WE_TEST and ISO_OT test) may not be asserted during 404.

In 406, while the isolation signal for the WL circuits is asserted, a read operation of the first bank may be initiated or performed. More specifically, the read operation may be performed to read the first test pattern that was written to the bank in 402, at the same memory locations. The read operation may be initiated by the testing circuit providing a RE signal (e.g., to a sense amp driver circuit) and an address for the read.

Because the ISO_WL signal is asserted, and assuming no stuck-at zero (deasserted) fault in the ISO_WL path, none of the word lines to the memory array 270 should be asserted. Thus, the bitline inputs to the senseamps 286A-286N should remain in the precharge state and the senseamps should detect random data. On the other hand, if a stuck-at zero fault exists in the ISO_WL path, the pattern written at 402 should be detected.

In 408, a result of the read operation in 406 may be compared to the first test pattern written in 402. The comparison may be performed by the testing circuit.

In 410, a result of the WL memory test may be determined (e.g., by the testing circuit). In one embodiment, where only a single test pattern is written and compared, the result of the WL memory test may be a pass if the result of the read operation in 406 does not match the first test pattern and may be a fail if the result of the read operation in 406 does match the first test pattern. The test fails if there is a match because, while the isolation signal is asserted, no word lines should be active, and accordingly, the results should be unpredictable. However, because there is a small probability that the result of the read can match the first test pattern due to random chance, steps 402-408 may be performed a multiple times (e.g., 2 times, 4 times, etc.) with different test patterns. In such embodiments, 410 may determine a pass if any read operation does not match the respective test pattern and may determine a fail if all read operations match the respective test patterns.

Additionally, the method of FIG. 6 may be performed for each bank individually. Alternatively, 402 may write the test pattern to all banks and 406-410 may be performed on each bank until the first pattern has been checked on each bank. Different test patterns may be performed in sequence using the same series of steps. Further, the pass or fail may be determined for the whole of the memory, e.g., if one bank fails, then the entire memory may be failed.

In one embodiment, the MBIST control circuit 220 may output a pass/fail (P/F) result to the overall test control circuit 220 by comparing the written test pattern and the result of the read. Accordingly, a matching pattern is actually a fail in this case, the P/F result is the opposite sense of the true P/F result. In contrast, other MBIST tests pass when the written pattern and read pattern match. To identify the inversion of the result, the MBIST control circuit 220 may assert the invert signal to the overall test control unit 230. In other embodiments, the MBIST control circuit 220 may control generation of the P/F result to assert a pass if the patterns mismatch for this test and a fail if the patterns match, and the invert signal may not be required.

Thus, FIG. 6 provides an exemplary method for checking isolation of WL control circuits in a memory.

FIG. 7 illustrates an exemplary method for testing isolation of a write enable circuit.

In 422, a first test pattern may be written to a first bank of a memory. The first test pattern may be written to a single bank of the memory or all banks of the memory, as desired. In one embodiment, the first test pattern may be a set of zeros, although other patterns are envisioned. The first test pattern may be written based on input from a testing circuit (e.g., providing a WE signal, an address for the write, and the test pattern). During 422, none of the isolate signals may be asserted.

In 424, an isolation signal for the WE control circuit may be asserted (ISO_WE). For example, the testing circuit may select test signals and may provide an asserted isolation signal for the WE control circuit. In one embodiment, the isolation signals for other circuits may not be asserted during 424 (e.g., ISO_WL and ISO_OT may not be asserted).

In 426, while the isolation signal for the WE control circuit is asserted, a write operation of a second test pattern may be initiated or performed. The second test pattern may be different than the first test pattern. Following the example above where the first test pattern is a set of zeroes, the second test pattern may be a set of ones. The write operation may be performed to write to the same bank written in 402, e.g., at the same memory locations as the first test pattern. Because the ISO_WE signal is asserted, in the absence of a stuck-at zero failure in the ISO_WE path, the second pattern should not be written to memory.

In 428, a read operation may be performed, without any isolation signals asserted.

In 430, a result of the read operation in 428 may be compared to the first test pattern written in 422 or the second test pattern written in 426 (or both). In one embodiment, the result of the read operation may be compared to the first test pattern.

In 432, a result of the WE memory test may be determined. In one embodiment, the result of the WE memory test may be a pass if the result of the read operation in 428 matches the first test pattern (or does not match the second test pattern) and may be a fail if the result of the read operation matches the second test pattern (or does not match the first test pattern). The test fails if the read operation matches the second test pattern because, while the assertion signal is asserted, the write operation of the second test pattern should not occur.

The method of FIG. 7 may be performed for each bank individually or all banks at once. Further, the pass or fail may be determined for the whole of the memory, e.g., if one bank fails, then the entire memory may be failed.

Thus, FIG. 7 provides an exemplary method for checking isolation of WE circuit(s) in a memory.

FIG. 8 illustrates an exemplary method for testing isolation of at least one sense amp control circuit.

In 442, a first test pattern may be written to a first bank of a memory and a second test pattern may be written to all other banks of the memory. For example, the first test pattern may be "10101 . . . " and the second test pattern may be a set of zeroes. The first and second test patterns may be written based on input from a testing circuit (e.g., providing a WE signal, an address for the writes, and the test patterns). During 442, none of the isolation signals may be asserted.

In 444, an isolation signal for the sense amp control circuit may be asserted (e.g. ISO_OT in the embodiment of FIGS. 2-4). For example, the testing circuit may select test signals and may assert the isolation signal for the sense amp control circuit (ISO_OT) and deassert the remaining isolation signals (ISO_WL and ISO_WE). In one embodiment, the isolation signal for the sense amp control circuit may also be used for isolation of other control circuits (e.g., other than the WE or WL circuits). Additionally, an isolation signal for another circuit may be asserted in 444, e.g., for a WE control circuit, e.g., to prevent WE versus PC contention.

In 446, while the isolation signal for the SA control circuit is asserted (and possibly the assertion signal for the WE control circuit), a read operation may be performed (e.g., for all banks). More specifically, the read operation may be performed to read the first test pattern that was written to the bank in 402, at the same memory locations. The read operation may be initiated by the testing circuit providing a RE signal (e.g., to a sense amp driver circuit) and an address for the read.

In 448, a result of the read operation in 446 may be compared to the first test pattern or second test pattern written in 442. The comparison may be performed by the testing circuit.

In 450, a result of the SA memory test may be determined (e.g., by the testing circuit). More specifically, the determined test result may be a pass if the result of the read in 448 is all zeroes (e.g., since a properly functioning sense amp returns zeroes during isolation) and may be a fail if the read matches the first test pattern.

In the embodiment of FIG. 8, the method may be repeated for each different bank, e.g., 440-448 may be performed until each bank has been tested across the entire memory array 270. Accordingly, the pass or fail in 450 may be determined for the whole of the memory, e.g., if one bank fails, then the entire memory may be failed. In embodiments where separate sense amp circuits are used for different banks or portions of the memory, it may be possible to test more than one bank at a time.

Thus, FIG. 8 provides an exemplary method for checking isolation of SA control circuit(s) in a memory.

Figure 9:
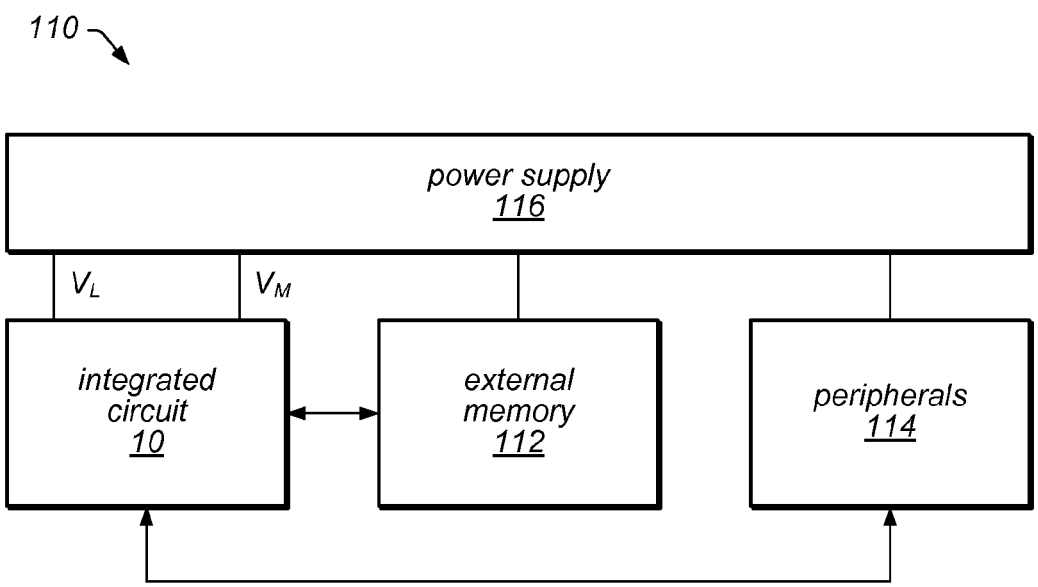
FIG. 9 is a block diagram of one embodiment of a system.

FIG. 9—Exemplary System

Turning next to FIG. 9, a block diagram of one embodiment of a system 110 is shown. In the illustrated embodiment, the system 110 includes at least one instance of the integrated circuit 10 coupled to one or more peripherals 114 and an external memory 112. A power supply 116 is also provided which supplies the $V_L$ and $V_M$ supply voltages to the integrated circuit 10 as well as one or more supply voltages to the memory 112 and/or the peripherals 114. In some embodiments, more than one instance of the integrated circuit 10 may be included.

The external memory 112 may be any desired memory. For example, the memory may comprise dynamic random access memory (DRAM), static RAM (SRAM), flash memory, or combinations thereof. The DRAM may comprise synchronous DRAM (SDRAM), double data rate (DDR) SDRAM, DDR2 SDRAM, DDR3 SDRAM, etc.

The peripherals 114 may include any desired circuitry, depending on the type of system 110. For example, in one embodiment, the system 110 may be a mobile device and the peripherals 114 may include devices for various types of wireless communication, such as WiFi, Bluetooth, cellular, global position system, etc. The peripherals 114 may also include additional storage, including RAM storage, solid state storage, or disk storage. The peripherals 114 may include user interface devices such as a display screen, including touch display screens or multitouch display screens, keyboard or other keys, microphones, speakers, etc.

Numerous variations and modifications will become apparent to those skilled in the art once the above disclosure is fully appreciated. It is intended that the following claims be interpreted to embrace all such variations and modifications.

What is claimed is:

1. A memory, comprising:
    a memory array;
    a plurality of control circuits configured to generate control signals for the memory array, wherein the plurality of control circuits comprise a plurality of word line driver circuits;
    a plurality of isolation circuits coupled to the plurality of control circuits, wherein the plurality of isolation circuits are configured to receive a plurality of isolation signals to isolate various ones of the control circuits, wherein a first isolation signal of the plurality of isolation signals corresponds to the plurality of word line driver circuits and at least one second isolation signal of the plurality of isolation signals corresponds to other ones of the plurality of control circuits, wherein the first isolation signal and the second isolation signal are independently controlled during a memory test to detect stuck-at faults associated with the plurality of isolation signals;
    wherein the memory is coupled to a testing circuit, wherein, to perform the memory test, the testing circuit is configured to:
        1) write a first test pattern in one or more memory locations of the memory array;
        2) assert the first isolation signal that controls isolation of the plurality of word line driver circuits;
        3) while the first isolation signal is asserted, perform a read of the one or more memory locations of the memory array;
        4) compare a result of the read to the first test pattern; and
        5) determine a test result based on said comparing.

2. The memory of claim 1, wherein the testing circuit is further configured to repeat 1-4 for a plurality of different test patterns, wherein said determining the test result is based on the plurality of different test patterns.

3. The memory of claim 1, wherein said determining the test result comprises determining a pass if the result of the read is different from the first test pattern.

4. The memory of claim 1, wherein the plurality of control circuits comprise a write enable driver circuit, wherein the at least one second isolation signal corresponds to the write enable driver circuit, wherein, to perform the memory test, the testing circuit is further configured to:
    assert the at least one second isolation signal that controls isolation of the write enable driver circuit;
    while the at least one second isolation signal is asserted, initiate a write of a test pattern to one or more memory locations of the memory array.

5. The memory of claim 1, wherein said determining the test result comprises determining a pass if the result of the read matches the first test pattern.

6. A memory, comprising:
    a memory array;
    a plurality of control circuits configured to generate control signals for the memory array, wherein the plurality of control circuits comprise a plurality of word line driver circuits;
    a plurality of isolation circuits coupled to the plurality of control circuits, wherein the plurality of isolation circuits are configured to receive a plurality of isolation signals to isolate various ones of the control circuits, wherein a first isolation signal of the plurality of isolation signals corresponds to the plurality of word line driver circuits and at least one second isolation signal of the plurality of isolation signals corresponds to other ones of the plurality of control circuits, wherein the first isolation signal and the second isolation signal are independently controlled during a memory test to detect stuck-at faults associated with the plurality of isolation signals;
    wherein the plurality of control circuits comprise a write enable driver circuit, wherein the at least one second isolation signal corresponds to the write enable driver circuit, wherein the memory is coupled to a testing circuit, wherein, to perform the memory test, the testing circuit is configured to:

1) write a first test pattern in one or more memory locations of the memory array;
2) assert the at least one second isolation signal that controls isolation of the write enable driver circuit;
3) while the at least one second isolation signal is asserted, perform a write of a second test pattern to one or more memory locations of the memory array;
4) perform a read of the one or more memory locations;
5) compare a result of the read to the first test pattern or the second test pattern; and
6) determine a test result based on said comparing.

7. The memory of claim 5, wherein the testing circuit is further configured to repeat 1-5 for a plurality of different test patterns, wherein said determining the test result is based on the plurality of different test patterns.

8. The memory of claim 5, wherein said determining the test result comprises determining a pass if the result of the read is different from the first test pattern.

9. The memory of claim 5, wherein said determining the test result comprises determining a pass if the result of the read matches the first test pattern.

10. A memory, comprising:
a memory array;
a plurality of control circuits configured to generate control signals for the memory array, wherein the plurality of control circuits comprise a plurality of word line driver circuits;
a plurality of isolation circuits coupled to the plurality of control circuits, wherein the plurality of isolation circuits are configured to receive a plurality of isolation signals to isolate various ones of the control circuits, wherein a first isolation signal of the plurality of isolation signals corresponds to the plurality of word line driver circuits and at least one second isolation signal of the plurality of isolation signals corresponds to other ones of the plurality of control circuits, wherein the first isolation signal and the second isolation signal are independently controlled during a memory test to detect stuck-at faults associated with the plurality of isolation signals;
wherein the memory comprises a plurality of banks, wherein the memory is coupled to a testing circuit, wherein, to perform the memory test, the testing circuit is configured to:
1) write a first test pattern to a first bank of the plurality of banks;
2) write a second test pattern to a second bank of the plurality of banks;
3) assert the at least one second isolation signal that controls isolation of the other ones of the plurality of control circuits;
4) while the at least one second isolation signal is asserted, perform a read from the first bank of the plurality of banks;
5) compare a result of the read to the first test pattern or the second test pattern; and
6) determine a test result based on said comparing.

11. The memory of claim 10, wherein the testing circuit is further configured to repeat 1-5 for a plurality of different test patterns, wherein said determining the test result is based on the plurality of different test patterns.

12. The memory of claim 10, wherein said determining the test result comprises determining a pass if the result of the read is different from the first test pattern.

13. The memory of claim 10, wherein said determining the test result comprises determining a pass if the result of the read matches the first test pattern.

14. The memory of claim 10, wherein the second test pattern comprises a set of '0's, and wherein the other ones of the plurality of control circuits comprise a sense amp driver circuit.

* * * * *